US012635511B2

(12) United States Patent
Liao et al.

(10) Patent No.: US 12,635,511 B2
(45) Date of Patent: May 19, 2026

(54) SEMICONDUCTOR DEVICE HAVING AIR GAP AND METHOD FOR MANUFACTURING THE SAME

(71) Applicant: TAIWAN SEMICONDUCTOR MANUFACTURING COMPANY, LTD., Hsinchu (TW)

(72) Inventors: Wei-Hao Liao, Hsinchu (TW); Hsi-Wen Tien, Hsinchu (TW); Yu-Teng Dai, Hsinchu (TW); Chih-Wei Lu, Hsinchu (TW); Hsin-Chieh Yao, Hsinchu (TW); Hwei-Jay Chu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 645 days.

(21) Appl. No.: 18/162,103

(22) Filed: Jan. 31, 2023

(65) Prior Publication Data

US 2024/0266212 A1 Aug. 8, 2024

(51) Int. Cl.

| | |
|---|---|
| ***H01L 21/768*** | (2006.01) |
| ***C08F 10/02*** | (2006.01) |
| ***C08F 10/06*** | (2006.01) |
| ***C08F 20/06*** | (2006.01) |
| ***C08F 20/32*** | (2006.01) |

(Continued)

(52) U.S. Cl.

CPC .......... *H01L 21/7682* (2013.01); *C08F 10/02* (2013.01); *C08F 10/06* (2013.01); *C08F 20/06* (2013.01); *C08F 20/32* (2013.01); *H01L 21/31138* (2013.01); *H01L 21/31144* (2013.01);

(Continued)

(58) Field of Classification Search

CPC ...................... H01L 21/7682; H01L 21/76837

See application file for complete search history.

(56) References Cited

U.S. PATENT DOCUMENTS

2006/0189143 A1* 8/2006 Tsai .................. H01L 21/76831 257/E21.264

2014/0252620 A1* 9/2014 Huang .............. H01L 23/53223 257/751

(Continued)

*Primary Examiner* — Erik Kielin

(74) *Attorney, Agent, or Firm* — Birch, Stewart, Kolasch & Birch, LLP

(57) ABSTRACT

A method for manufacturing a semiconductor device includes: forming metal lines on a conductive interconnect structure disposed on a substrate; forming functionalized polymers, each of which includes a carbon-based polymer chain and a functional group that is bonded to a lateral surface of a corresponding one of the metal lines and that is represented by formula (A):

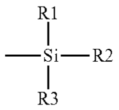

wherein R1, R2, R3 are defined herein; removing the carbon-based polymer chain of an upper portion of the functionalized polymers to leave the carbon-based polymer chain of remainder of the functionalized polymers and to form recesses; forming a dielectric layer to fill the recesses; and removing the carbon-based polymer chain of the remainder of the functionalized polymers to form air gaps among the metal lines.

20 Claims, 6 Drawing Sheets

(51) Int. Cl.
*H01L 21/311* (2006.01)
*H01L 23/532* (2006.01)

(52) U.S. Cl.
CPC .. *H01L 21/76805* (2013.01); *H01L 21/76814* (2013.01); *H01L 23/5329* (2013.01)

(56) References Cited

U.S. PATENT DOCUMENTS

| | | | | |
|---|---|---|---|---|
| 2021/0193566 | A1* | 6/2021 | Lo | H01L 21/76885 |
| 2021/0313228 | A1* | 10/2021 | Nguyen | H01L 21/321 |
| 2022/0223465 | A1* | 7/2022 | Huang | H01L 23/5226 |
| 2023/0238236 | A1* | 7/2023 | Peethala | H01L 21/02118<br>438/765 |

* cited by examiner

SEMICONDUCTOR DEVICE HAVING AIR GAP AND METHOD FOR MANUFACTURING THE SAME

BACKGROUND

With rapid development of semiconductor manufacturing technology, continual reduction in minimum feature sizes is a trend in the semiconductor industry. As the feature sizes in an integrated circuit (IC) chip are decreased, the distance between interconnect metal features (e.g., metal lines) is continually reduced in advanced nodes, which might induce resistance-capacitance (RC) delay and electronic signal interference. Therefore, the semiconductor industry strives to reduce the RC delay and electronic signal interference of the IC chip so as to further improve chip performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
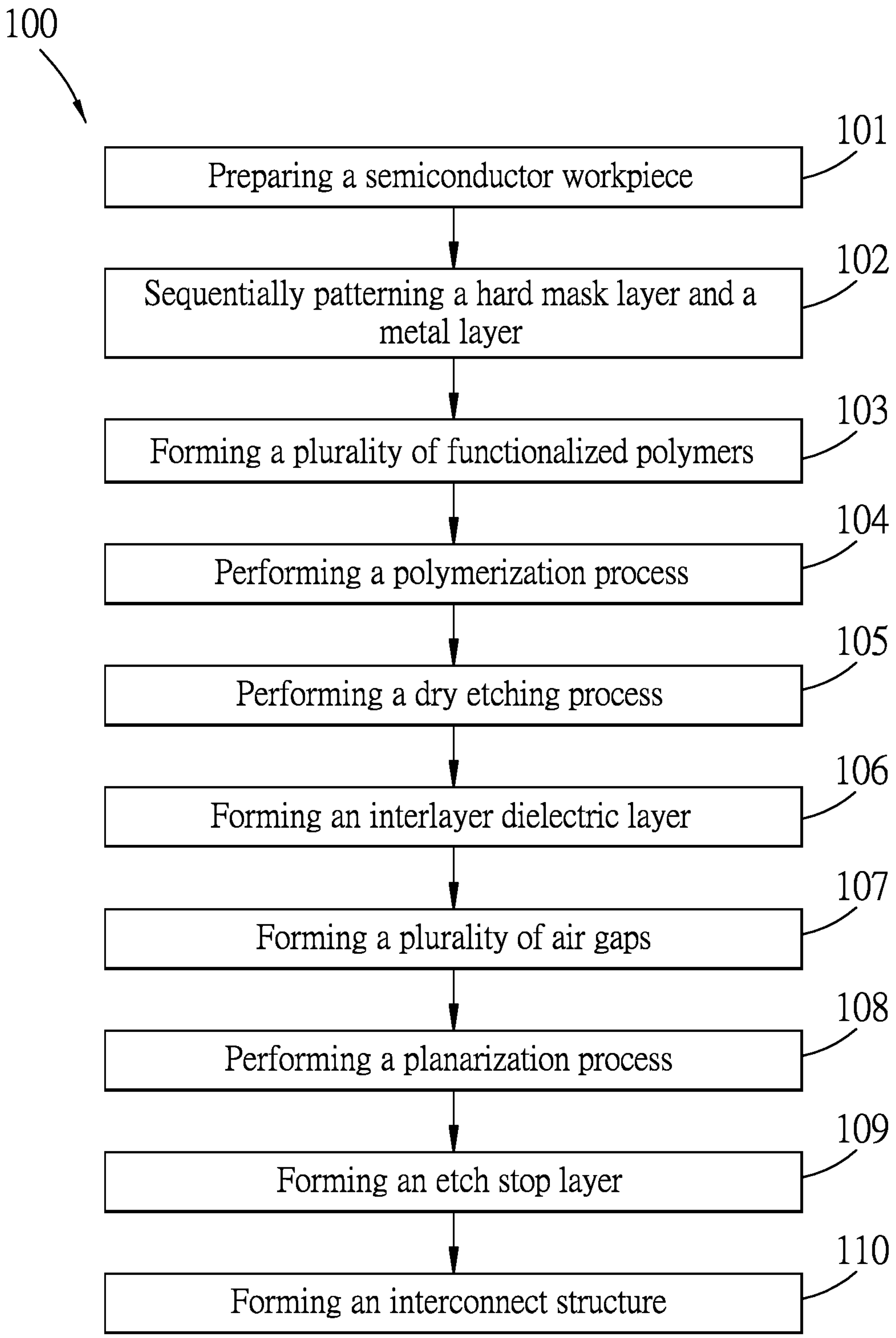
FIG. 1 is a flow diagram illustrating a method for manufacturing a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “on,” “over,” “top,” “bottom,” “upper,” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be noted that the element(s) or feature(s) are exaggeratedly shown in the figures for the purposed of convenient illustration and are not in scale.

For the purposes of this specification and appended claims, unless otherwise indicated, all numbers expressing amounts, sizes, dimensions, proportions, shapes, formulations, parameters, percentages, quantities, characteristics, and other numerical values used in the specification and claims, are to be understood as being modified in all instances by the term “about” even though the term “about” may not expressly appear with the value, amount or range. Accordingly, unless indicated to the contrary, the numerical parameters set forth in the following specification and attached claims are not and need not be exact, but may be approximate and/or larger or smaller as desired, reflecting tolerances, conversion factors, rounding off, measurement error and the like, and other factors known to those of skill in the art depending on the desired properties sought to be obtained by the presently disclosed subject matter. For example, the term “about,” when referring to a value can be meant to encompass variations of, in some aspects±10%, in some aspects±5%, in some aspects±2.5%, in some aspects±1%, in some aspects±0.5%, and in some aspects±0.1% from the specified amount, as such variations are appropriate to perform the disclosed methods or employ the disclosed compositions.

In advanced nodes of semiconductor technology, as the features in a semiconductor device are scaled down, difficulty of manufacturing process for the semiconductor device is also increased (e.g., depositing a metal material layer to fill a plurality of trenches that are formed by patterning an inter-layer dielectric (ILD) layer, so as to form a plurality of metal lines). In order to reduce the difficulty of the metal material layer filling the trenches, a metal reactive ion etching (RIE) process has been developed to form the metal lines. In a current manufacturing process for the semiconductor device, after formation of the metal lines using the metal RIE process, a dielectric material layer is deposited by chemical vapor deposition (CVD) to fill a trench located between two adjacent ones of the metal lines. Because the trench has a small critical dimension, the dielectric material layer may not fully fill the trench, resulting in an air gap being formed in the trench. The air gap has a relatively low dielectric constant (k), which is conducive for reducing resistance-capacitance (RC) delay and electronic signal interference of the semiconductor device. However, because filling of the dielectric material layer in the trench may be affected by the critical dimension of the trench and various patterning density and topography of the ILD layer, size and height of the air gap are difficult to be controlled, such that the air gap exhibits a non-uniform shape, which is not advantageous for reducing RC delay and electronic signal interference of the semiconductor device.

The present disclosure is directed to a semiconductor device and a method for manufacturing the same. FIG. 1 is a flow diagram illustrating a method 100 for manufacturing a semiconductor device (for example, a semiconductor device 200 shown in FIGS. 10 and 11) in accordance with some embodiments. FIGS. 2 to 11 illustrate schematic views of some intermediate stages of the method 100. Some portions may be omitted in FIGS. 2 to 11 for the sake of brevity. Additional steps can be provided before, after or during the method 100, and some of the steps described herein may be replaced by other steps or be eliminated.

Figure 2:
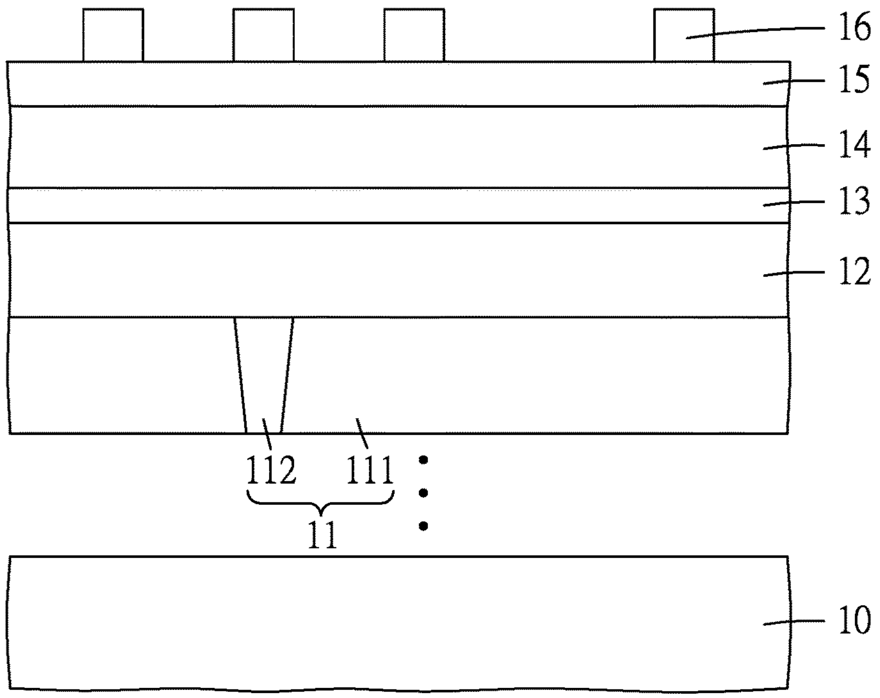
FIGS. 2 to 11 are schematic views illustrating some intermediate stages of the method as depicted in FIG. 1 in accordance with some embodiments.

Referring to FIGS. 1 and 2, the method 100 begins at step 101, where a semiconductor workpiece is prepared on a substrate 10. The semiconductor workpiece includes a conductive interconnect structure 11, a metal layer 12, a hard mask layer 13, a bottom layer 14, a middle layer 15, and a patterned mask layer 16, which are formed in this order on the substrate 10.

In some embodiments, the substrate 10 may be a semiconductor substrate, e.g., an elemental semiconductor or a compound semiconductor. An elemental semiconductor is composed of single species of atoms, such as silicon (Si) or germanium (Ge) in column IV of the periodic table. A compound semiconductor is composed of two or more elements, such as silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or the like. The compound semiconductor may have a gradient feature in which the composition thereof changes from one ratio at one location to another ratio at another location in the compound semiconductor. The compound semiconductor may be formed over a silicon substrate. The compound semiconductor may be strained. In some embodiments, the substrate 10 may include a multilayer compound semiconductor device. Alternatively, the substrate 10 may include a non-semiconductor material, such as a glass, fused quartz, or calcium fluoride. In some embodiments, the substrate 10 may be a semiconductor on insulator (SOI) (e.g., silicon germanium on insulator (SGOI)). Generally, an SOI substrate includes a layer of a semiconductor material such as epitaxial silicon (Si), germanium (Ge), silicon germanium (SiGe), or combinations thereof. In some embodiments, the substrate 10 may be doped with a p-type dopant, such as boron (Br), aluminum (Al), gallium (Ga), or the like, or may alternatively be doped with an n-type dopant.

The conductive interconnect structure 11 may be formed on the substrate 10. In some embodiments, the conductive interconnect structure 11 may include a first dielectric layer 111 formed with a first electrically conductive interconnect 112 (e.g., an electrically conductive via contact). The first dielectric layer 111 may be made of a dielectric material, for example, but not limited to, silicon oxide, SiOC-based materials (e.g., SiOCH), borophosphosilicate glass (BPSG), undoped silicate glass (USG), fluorinated silicate glass (FSG), high-density plasma (HDP) oxide, fluorine-doped silicon oxide, carbon-doped silicon oxide, porous silicon oxide, porous carbon-doped silicon oxide, organic polymers, or silicone based polymers. Other suitable dielectric materials for the first dielectric layer 111 are within the contemplated scope of the present disclosure. The first dielectric layer 111 may be formed on the substrate 10 by a suitable deposition process, for example, but not limited to, CVD, physical vapor deposition (PVD), atomic layer deposition (ALD), or other suitable deposition processes. In some embodiments, the first dielectric layer 111 is formed with an opening (not shown). The first electrically conductive interconnect 112 is formed in the opening of the first dielectric layer 111. The step for forming the first electrically conductive interconnect 112 may include sub-step (i) forming an electrically conductive material layer on the first dielectric layer 111 and in the opening of the first dielectric layer 111, and sub-step (ii) conducting a planarization process (for example, but not limited to, a chemical mechanical polishing (CMP) process) to remove the electrically conductive material layer on the first dielectric layer 111, so as to form the first electrically conductive interconnect 112 in the opening of the first dielectric layer 111. The electrically conductive material layer may include, for example, but not limited to, copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), gold (Au), aluminum (Al), or alloys thereof. Other suitable materials for the first electrically conductive interconnect 112 are within the contemplated scope of the present disclosure. The electrically conductive material layer may be formed by a suitable deposition process, for example, but not limited to, CVD, PVD, ALD, electroless plating, electroplating, or other suitable deposition processes. In some embodiments, the conductive interconnect structure 11 may include a plurality of the first electrically conductive interconnects 112.

The metal layer 12 is disposed on the conductive interconnect structure 11 opposite to the substrate 10. The metal layer 12 may be made of an electrically conductive material or a low electrical resistance material. The electrically conductive material (or the low electrical resistance material) may include, for example, but not limited to, osmium (Os), Ir, Co, niobium (Nb), Pt, Rh, Rhenium (Re), Cu, W, Cr, Ru, Vanadium (V), Pd, Mo, Al, or alloys thereof. Other suitable materials for the metal layer 12 are within the contemplated scope of the present disclosure. The metal layer 12 may be formed by a suitable deposition process, for example, but not limited to, PVD, ALD, or other suitable deposition processes. In some embodiments, process parameters for depositing the metal layer 12 may include a temperature that ranges from about 10° C. to about 450° C. In some embodiments, the metal layer 12 may have a thickness ranging from about 200 Å to about 500 Å, and other ranges of the thickness value are also within the contemplated scope of the present disclosure. The metal layer 12 may have a relatively high etching selectivity with respect to the first dielectric layer 111. In some embodiments, an etching selectivity of the metal layer 12 with respect to the first dielectric layer 111 may be greater than about 5. In some embodiments, the semiconductor workpiece may further include a glue layer (not shown) disposed between the metal layer 12 and the conductive interconnect structure 11. The glue layer may include, for example, but not limited to, tantalum (Ta), titanium (Ti), tantalum nitride (TaN), titanium nitride (TiN), or combinations thereof. Other suitable materials for the glue layer are within the contemplated scope of the present disclosure. The metal layer 12 may have a relatively high etching selectivity with respect to the glue layer. In some embodiments, an etching selectivity of the metal layer 12 with respect to the glue layer may be greater than about 5. The glue layer can provide a good adhesion to the metal layer 12 and the conductive interconnect structure 11.

The hard mask layer 13 is disposed on the metal layer 12 opposite to the conductive interconnect structure 11. The hard mask layer 13 may include a hard mask material having a high etchant resistance with respect to the metal layer 12. In some embodiments, the hard mask layer 13 may include silicon oxide (SiOx), silicon nitride, silicon carbide, silicon oxycarbide, silicon oxynitride, silicon carbonitride, silicon oxycarbonitride, Ti, Ta, aluminum oxide (AlOx), or combinations thereof. Other suitable materials for the hard mask layer 13 are within the contemplated scope of the present disclosure. The hard mask layer 13 may be formed by a suitable deposition process, for example, but not limited to, CVD, PVD, ALD, or other suitable deposition processes. In some embodiments, process parameters for depositing the hard mask layer 13 may include a temperature that ranges from about 10° C. to about 400° C. In some embodiments, the hard mask layer 13 may have a thickness ranging from about 100 Å to about 250 Å, and other ranges of the thickness value are also within the contemplated scope of the present disclosure. The metal layer 12 has a relatively high etching selectivity with respect to the hard mask layer 13. In some embodiments, an etching selectivity of the metal layer 12 with respect to the hard mask layer 13 may be greater than about 8.

The bottom layer 14 is disposed on the hard mask layer 13 opposite to the metal layer 12. The bottom layer 14 may be made of a carbon-based polymer (e.g., a photoresist polymer). Other suitable materials for the bottom layer 14 are within the contemplated scope of the present disclosure. The bottom layer 14 may be formed by a suitable deposition process, for example, but not limited to, CVD, spin-on coating, or other suitable deposition processes.

The middle layer 15 is disposed on the bottom layer 14 opposite to the hard mask layer 13. The middle layer 15 may be made of an oxide-based material. In some embodiments, the middle layer 15 may include silicon oxide, silicon oxycarbide, silicon oxynitride, silicon oxycarbonitride, or combinations thereof. Other suitable materials for the middle layer 15 are within the contemplated scope of the present disclosure. The middle layer 15 may be formed by a suitable deposition process, for example, but not limited to, CVD, PVD, ALD, spin-on coating, or other suitable deposition processes.

The patterned mask layer 16 is disposed on the middle layer 15 opposite to the bottom layer 14. The step for forming the patterned mask layer 16 may include sub-step (i) forming a mask material layer on the middle layer 15, and sub-step (ii) conducting a photolithography process to pattern the mask material layer, so as to obtain the patterned mask layer 16. The mask material layer may be made of a photoresist. Other suitable materials for the patterned mask layer 16 are within the contemplated scope of the present disclosure. The mask material layer may be formed by a suitable deposition process, for example, but not limited to, spin-on coating or other suitable deposition processes.

Figure 3:
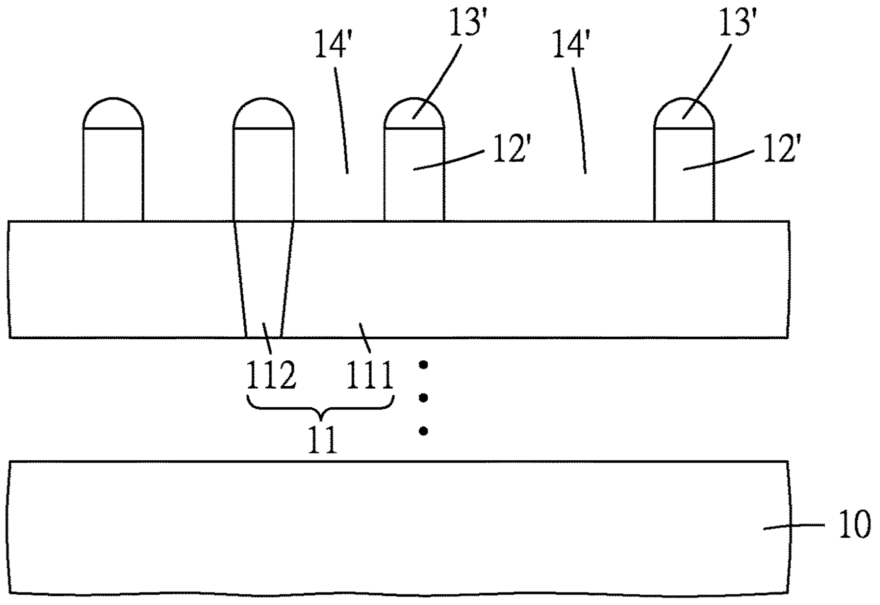

Referring to FIGS. 1 and 3, the method 100 then proceeds to step 102, where the hard mask layer 13 and the metal layer 12 are sequentially patterned to form a plurality of hard masks 13' and a plurality of metal lines 12'. Step 102 may include sub-steps (i) and (ii). In sub-step (i), the hard mask layer 13 may be patterned by photolithography process to sequentially etch the middle layer 15, the bottom layer 14, and the hard mask layer 13 to form the hard masks 13' that are spacedly disposed on the metal layer 12. In this sub-step, the patterned mask layer 16 is used as a mask in the photolithography process. In some embodiments, a cross-section of each of the hard masks 13' may have a semi-circular shape. Other shapes of the cross-section of the hard mask 13' are within the contemplated scope of the present disclosure. In sub-step (ii), the metal layer 12 may be patterned by the RIE process with parameters to form the metal lines 12' that are spacedly disposed on the conductive interconnect structure 11. Each of the metal lines 12' is disposed below a corresponding one of the hard masks 13'. A plurality of trenches 14' are formed among the metal lines 12' such that two adjacent ones of the metal lines 12' are spaced apart from each other by a corresponding one of the trenches 14'. In this sub-step, the hard masks 13' are used as masks in the RIE process. In some embodiments, the RIE process may be an inductively coupled plasma (ICP) RIE process. In some embodiments, the gas used in the ICP RIE process may be, for example, but not limited to, hydrogen bromide (HBr), chlorine ($Cl_2$), hydrogen ($H_2$), methane ($CH_4$), nitrogen ($N_2$), helium (He), neon (Ne), krypton (Kr), tetrafluoromethane ($CF_4$), trifluoromethane ($CHF_3$), methyl fluoride ($CH_3F$), difluoromethane ($CH_2F_2$), octafluorocyclobutane ($C_4F_8$), hexafluorobutadiene ($C_4F_6$), oxygen ($O_2$), argon (Ar), or other suitable gases. In some embodiments, the parameters of the ICP RIE process may include a power that ranges from about 100 watt (W) to about 2000 W. In some embodiments, the parameters of the ICP RIE process may include a bias that ranges from about 0 voltage (V) to about 1200 V.

Figure 4:
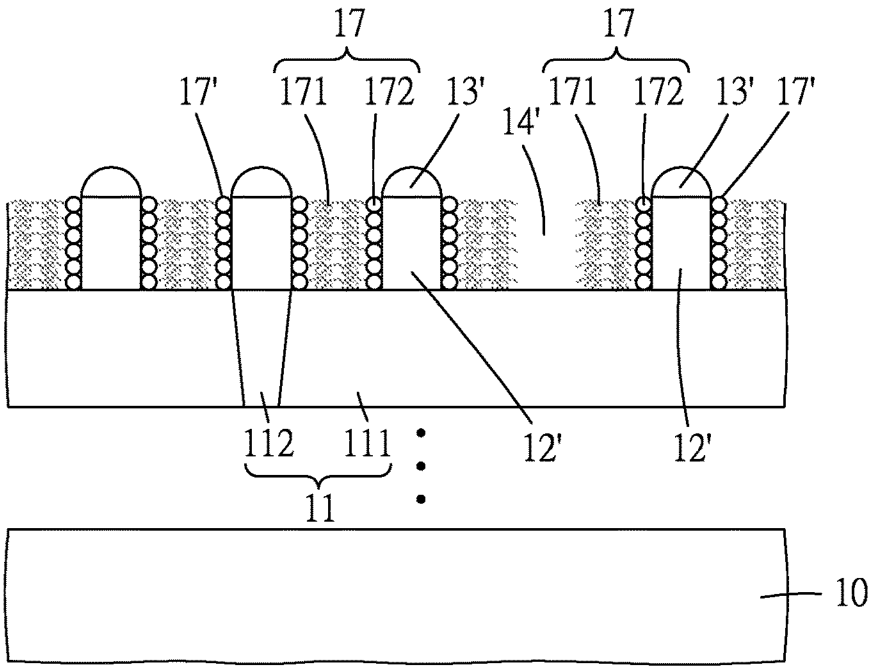

Referring to FIGS. 1 and 4, the method 100 then proceeds to step 103, where a plurality of functionalized polymers 17 are selectively deposited on a lateral surface of a corresponding one of the metal lines 12'. Each of the functionalized polymers 17 may include a carbon-based polymer chain 171 and a functional group 172 that can be bonded to the lateral surface of the corresponding one of the metal lines 12'. In some embodiments, the carbon-based polymer chain 171 may be a polymer chain of a suitable polymer, which may include, for example, but not limited to, polymethyl methacrylate (PMMA), polypropylene (PP), polyethylene (PE), epoxy, copolymers thereof, or other suitable polymers. In some embodiments, the carbon-based polymer chain 171 may have a molecular weight ranging from about 2000 to about 200000. If the molecular weight of the carbon-based polymer chain 171 is lower than about 2000, the carbon-based polymer chain 171 may have a short chain length, which may result in an air gap 19 (will be described hereinafter with reference to, for example, FIG. 8) to be formed having a poor size. If the molecular weight of the carbon-based polymer chain 171 is greater than about 200000, the functionalized polymers 17 may have a higher viscosity and the carbon-based polymer chain 171 may cover the functional group 172, such that the functional group 172 may not be bonded to the lateral surface of the corresponding one of the metal lines 12'. In some embodiments, the functional group 172 may be a terminal group that is bonded to the carbon-based polymer chain 171. In some embodiments, the functional group 172 may be a silane-based terminal group and may be represented by Formula (A),

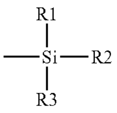

(A)

wherein

R1, R2, R3 are each independently a methoxy group (—$OCH_3$), a thiol group (—SH), or a dihydrogen phosphate group (—$H_2PO_4$) with the proviso that at least one of R1, R2, and R3 is the methoxy group.

In some embodiments, the functional groups 172 of two adjacent ones of the functionalized polymers 17 may react with each other to form a silicon-oxygen-silicon (Si—O—Si) covalent bond through a sol-gel reaction of the methoxy group. In some embodiments, one of R1, R2, and R3 of each of the functional groups 172 is bonded to the lateral surface of the corresponding one of the metal lines 12', and the other two of R1, R2, and R3 of each of the functional groups 172 are the methoxy groups for conducting the sol-gel reaction. In this case, the functional groups 172 of the functionalized polymers 17 may be corporately formed as a protective layer 17' through the Si—O—Si covalent bonds, and the protective layer 17' is used to protect the lateral surface of the corresponding one of the metal lines 12'. In other words, the functional group 172 of each of the functionalized polymers

17 is bonded to the functional group 172 of an adjacent one of the functionalized polymers 17 by the sol-gel reaction, so as to form the protective layer 17' covering the lateral surface of the corresponding one of the metal lines 12'. In some embodiments, the functional group 172 may form a covalent bond with the lateral surface of the metal line 12' through at least one of the methoxy group, the thiol group, and the dihydrogen phosphate group. In some embodiments, the functional group 172 may be covalently bonded to the lateral surface of the corresponding one of the metal lines 12' through two of R1, R2, and R3, each of which is independently the methoxy group, the thiol group, or the dihydrogen phosphate group, and the remaining one of R1, R2, and R3 is the methoxy group for conducting the sol-gel reaction. In some embodiments, step 103 may be performed by immersing the structure shown in FIG. 3 in a solution that contains the functionalized polymers 17 and a solvent for dispersing the functionalized polymers 17. In some embodiments, the functionalized polymers 17 may have a concentration ranging from about 30% to about 70% in the solution. When the concentration of the functionalized polymers 17 is lower than about 30% in the solution, step 103 may need to be performed for a longer reaction period, so as to enable the functional groups 172 to be reacted with the lateral surfaces of the metal lines 12'. When the concentration of the functionalized polymers 17 is greater than about 70% in the solution, the carbon-based polymer chains 171 may crosslink with each other to an undesirable extent, resulting in a higher viscosity to disallow the functional groups 172 to be reacted with the lateral surfaces of the metal lines 12'. In some embodiments, the solvent may be, for example, but not limited to, tetrahydrofuran (THF), dimethylacetamide (DMAC), methanol, acetone, or other suitable solvents. In some embodiments, step 103 may be performed at a reaction temperature ranging from about 0° ° C. to about 60° C. In some embodiments, step 103 may be performed for a reaction period ranging from about 3 minutes to about 20 minutes. When the reaction period is shorter than about 3 minutes, the functional groups 172 may not be completely reacted with the lateral surfaces of the metal lines 12'. When the reaction period is longer than about 20 minutes, the carbon-based polymer chains 171 may crosslink with each other to an undesirable extent, which may lead to an increased viscosity of the solution and may adversely affect the functional groups 172 being reacted with the lateral surfaces of the metal lines 12'.

Figure 5:
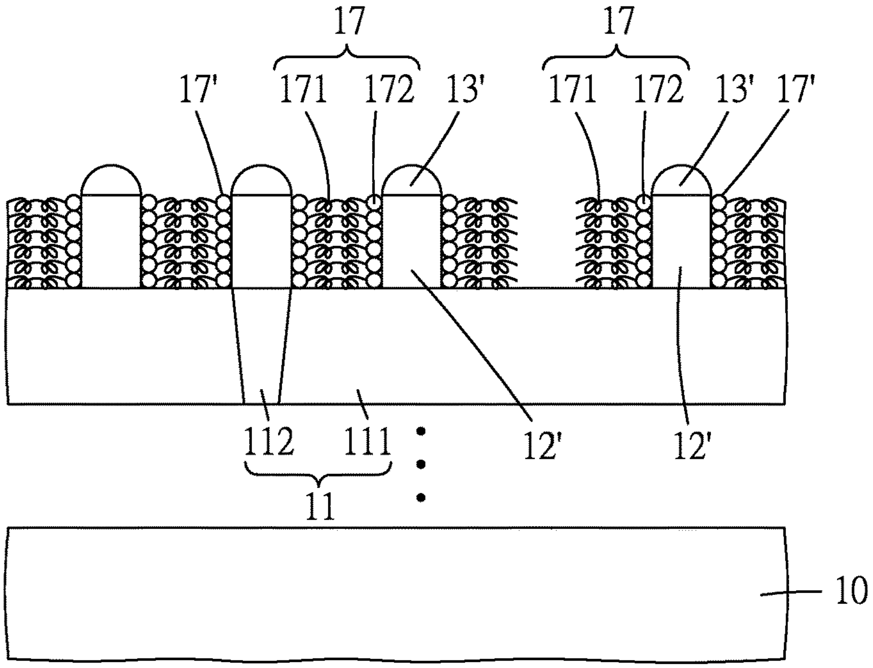

Referring to FIGS. 1 and 5, the method 100 then proceeds to step 104, where the functionalized polymers 17 undergo a polymerization process to increase a mechanical strength thereof. It is noted that step 104 may be omitted as long as the mechanical strength of the functionalized polymers 17 is sufficient to support an interlayer dielectric (ILD) layer 18 (shown in FIG. 7) that is to be formed in a subsequent step.

Figure 6:
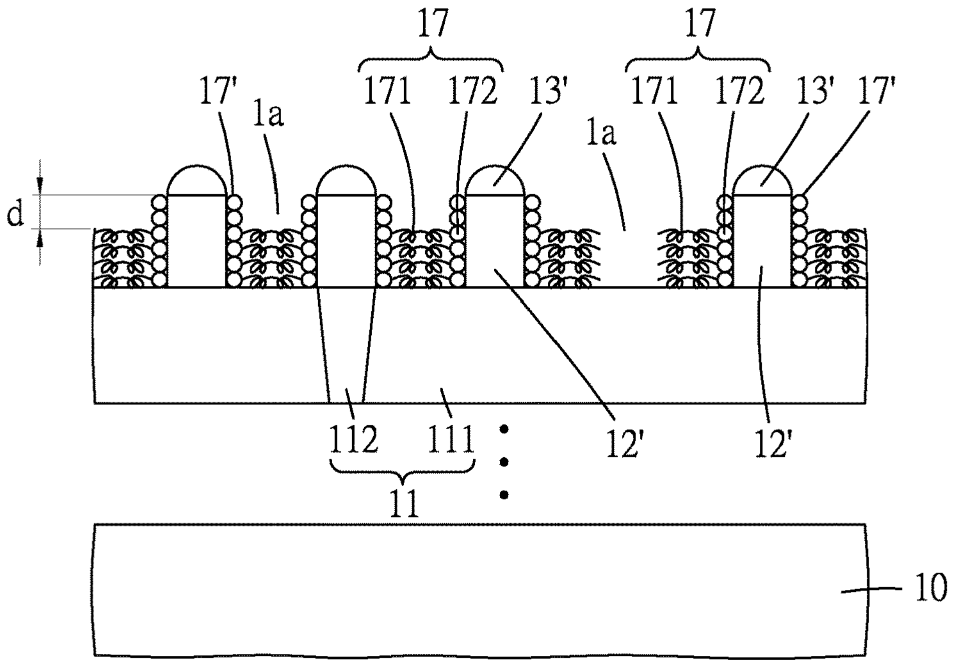

Referring to FIGS. 1 and 6, the method 100 then proceeds to step 105, where a dry etching process is conducted on the structure shown in FIG. 5, such that the carbon-based polymer chain 171 of an upper portion of the functionalized polymers 17 is removed to leave the carbon-based polymer chain 171 of remainder of the functionalized polymers 17, and to form a plurality of recesses 1*a*. A gas used in the dry etching process may include, but not limited to, oxygen ($O_2$), hydrogen ($H_2$) or other suitable gases. Each of the recesses 1*a* may be formed between two corresponding ones of the metal lines 12'. In some embodiments, each of the recesses 1*a* may be defined by upper portions of two corresponding ones of the protective layers 17' and the carbon-based polymer chain 171 of corresponding remainder of the functionalized polymers 17. After this step, a distance (d) between a top surface of the remainder of the functionalized polymers 17 and a top surface of the metal lines 12' may range from about 20 Å to about 50 Å.

Figure 7:
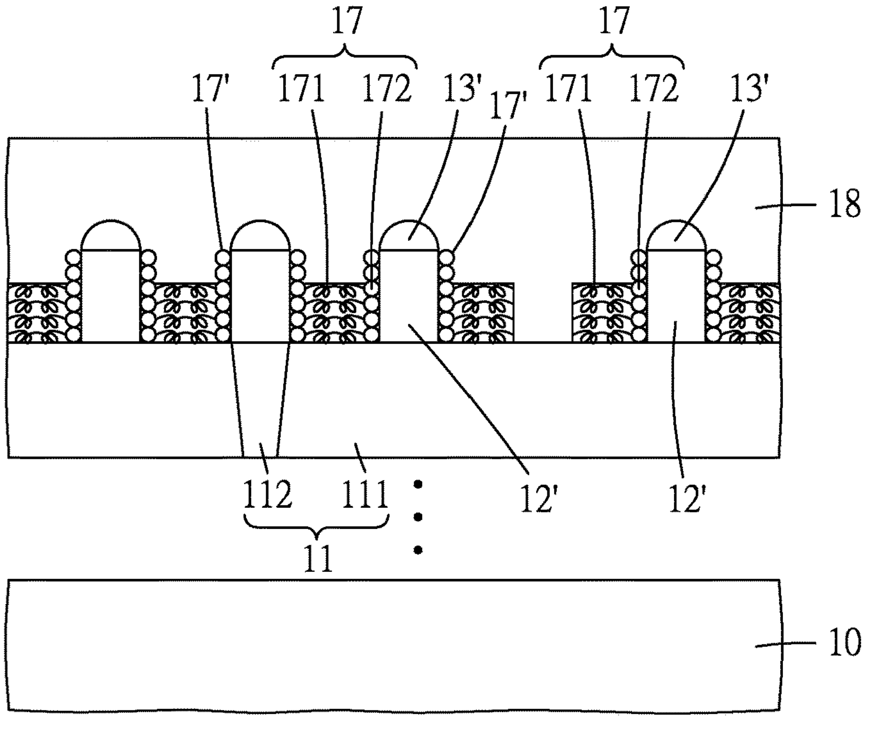

Referring to FIGS. 1 and 7, the method 100 then proceeds to step 106, where the ILD layer 18 is formed on the structure shown in FIG. 6 and fills the recesses 1*a*. The ILD layer 18 may be made of a low dielectric constant (k) material, for example, but not limited to, aluminum compounds (e.g., aluminum nitride, aluminum oxynitride, aluminum oxide, etc.), silicon compounds (e.g., silicon oxide, silicon oxycarbide, silicon oxynitride, silicon carbonitride, silicon oxycarbonitride, etc.), and combinations thereof. Other suitable low k materials for the ILD layer 18 are within the contemplated scope of the present disclosure. Alternatively, the ILD layer 18 may be made of a porous material. In some embodiments, when the ILD layer 18 is made of a porous material, the ILD layer 18 may have a porosity ranging from about 20% to about 40%. The ILD layer 18 may be formed by a suitable deposition process, for example, but not limited to, PVD, CVD, ALD, or other suitable deposition processes.

Figure 8:
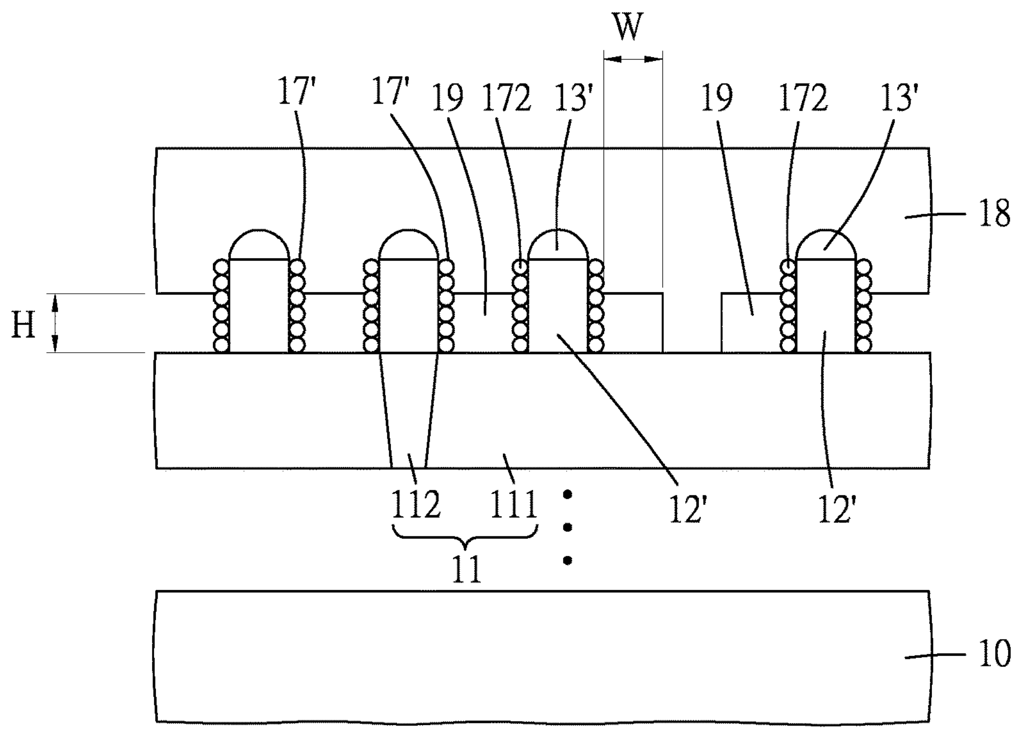

Referring to FIGS. 1 and 8, the method 100 then proceeds to step 107, where the carbon-based polymer chains 171 of the remainder of the functionalized polymers 17 are fully removed to form a plurality of the air gaps 19 among the metal lines 12'. Step 107 may be performed by a thermal annealing process to permit the carbon-based polymer chains 171 of the remainder of the functionalized polymers 17 to vaporize so as to become ash that is left in the air gaps 19. In some embodiments, the thermal annealing process may be conducted at a temperature ranging from about 300° C. to about 400° C. When the temperature is lower than about 300° C., the carbon-based polymer chains 171 of the remainder of the functionalized polymers 17 may not be vaporized completely, which is not conducive to forming the air gaps 19. When the temperature is higher than about 400° C., the ILD layer 18 may be damaged. In some embodiments, when the ILD layer 18 is made of a porous material, the carbon-based polymer chains 171 of the remainder of the functionalized polymers 17 can be vaporized and removed through pores of the ILD layer 18 during the thermal annealing process. As described above with reference to step 106, when the ILD layer 18 is made of a porous material, the ILD layer 18 may have a porosity ranging from about 20% to about 40%. When the porosity of the ILD layer 18 is lower than about 20%, the carbon-based polymer chains 171 of the remainder of the functionalized polymers 17 may not be removed effectively through pores of the ILD layer 18 during the thermal annealing process, and some ash may remain in the air gaps 19, which may affect the size of the air gaps 19. When the porosity of the ILD layer 18 is greater than about 40%, the ILD layer 18 may have a poor mechanical strength. In some embodiments, the air gaps 19 may be formed in a self-aligned manner. In some embodiments, each of the air gaps 19 may have a width (W) ranging from about 5 nm to about 15 nm. In some embodiments, each of the air gaps 19 may have a height (H) ranging from about 150 Å to about 480 Å. Two adjacent ones of the metal lines 12' may be spaced apart from each other by a corresponding one of the air gaps 19. Alternatively, two adjacent ones of the metal lines 12' may be spaced apart from each other by two corresponding ones of the air gaps 19 that are spaced apart from each other by a portion of the ILD layer 18. In some embodiments, one of the air gaps 19 may be disposed between two corresponding ones of the protective layers 17'. In some embodiments, one of the air gaps 19 may be disposed between a corresponding one of the protective layers 17' and a portion of the ILD layer 18.

Figure 9:
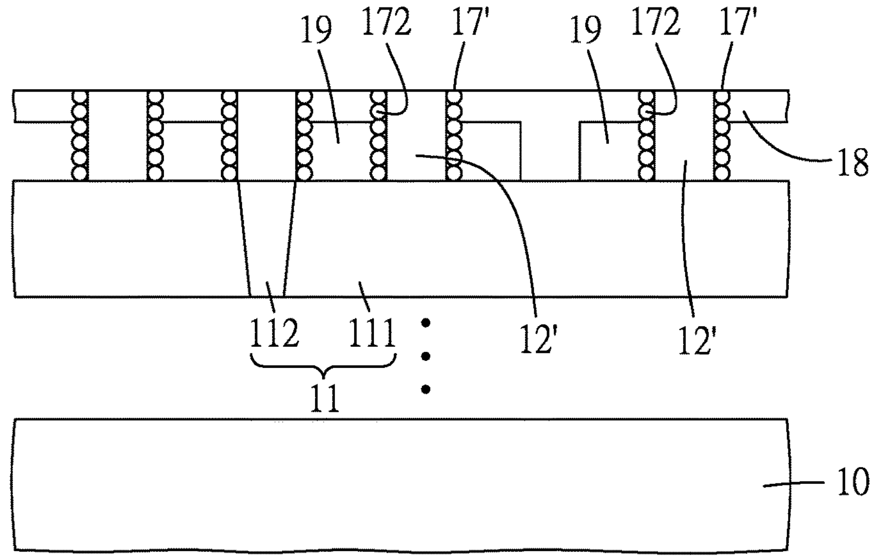
Figure 10:
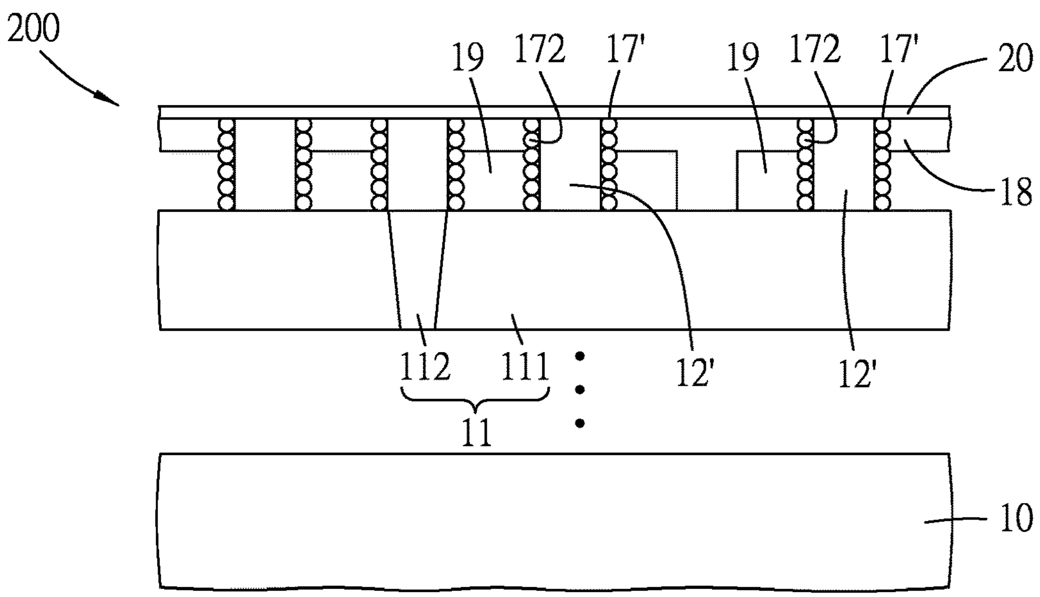

Referring to FIGS. 1 and 9, the method 100 then proceeds to step 108, where the ILD layer 18 is planarized to a point that the top surfaces of the metal lines 12' are exposed. Step 108 may be performed by a suitable planarization process, for example, but not limited to, the CMP process or other suitable planarization processes. In this step, the hard masks 13' are fully removed. As described above with reference to FIG. 6, the distance (d) between the top surface of the remainder of the functionalized polymers 17 and the top surface of the metal lines 12' may range from about 20 Å to about 50 Å. When the distance (d) is shorter than about 20 Å, portions of the ILD layer 18 respectively disposed in the recesses 1*a* may be fully removed after this step, which may hinder disposition of an etch stop layer 20 that is to be formed in a subsequent step, as shown in FIG. 10. When the distance (d) is greater than about 50 Å, the size of each of the air gaps 19 may become smaller, which is not conducive to reducing the RC delay and the electronic interference of the semiconductor device 200.

Referring to FIGS. 1 and 10, the method 100 then proceeds to step 109, where an etch stop layer (ESL) 20 is formed over the structure shown in FIG. 9. The ESL 20 may include, for example, but not limited to, silicon oxide, silicon nitride, silicon oxynitride, or combinations thereof. Other suitable materials for the ESL 20 are within the contemplated scope of the present disclosure. The ESL 20 may be formed by a suitable deposition process, for example, but not limited to, CVD, PVD, ALD, PECVD, PEALD, or other suitable deposition processes. After this step, the semiconductor device 200 is obtained.

Figure 11:
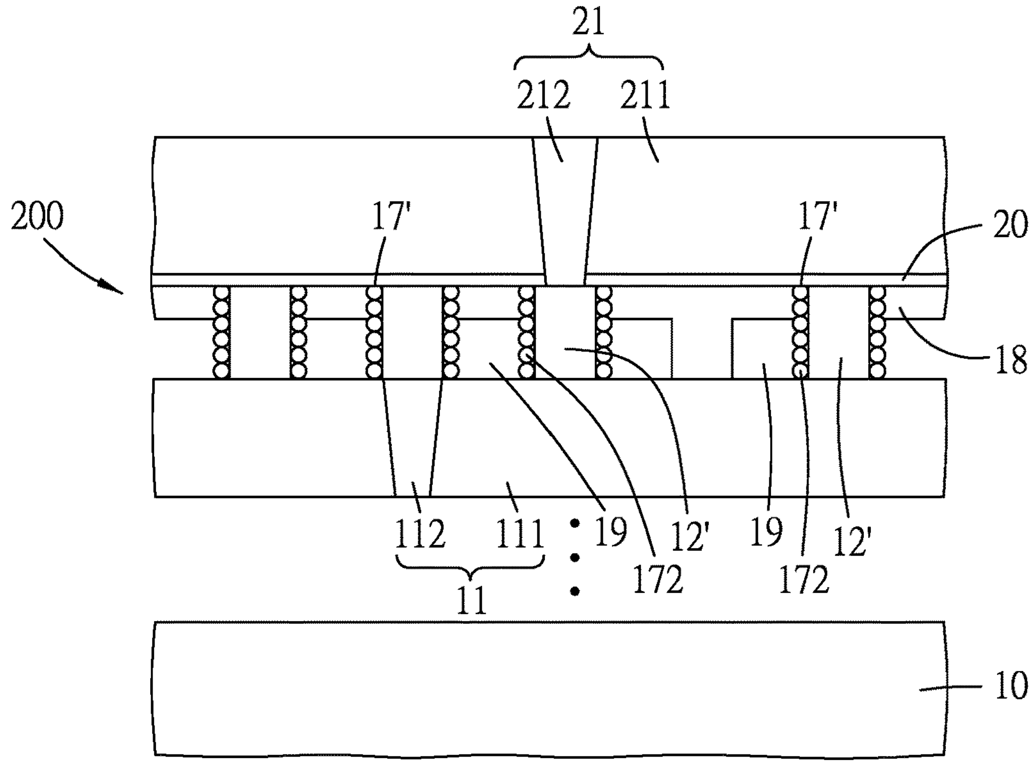

Referring to FIGS. 1 and 11, the method 100 then proceeds to step 110, where an interconnect structure 21 is formed on the semiconductor device 200 shown in FIG. 10. The interconnect structure 21 may include a second dielectric layer 211 and a second electrically conductive interconnect 212 (e.g., an electrically conductive via contact). The second dielectric layer 211 of the interconnect structure 21 is formed over the ESL 20 of the semiconductor device 200. The material and process for forming the second dielectric layer 211 of the interconnect structure 21 are similar to those of the first dielectric layer 111 as described in step 101, and therefore, the details thereof are omitted for the sake of brevity. The second electrically conductive interconnect 212 of the interconnect structure 21 is disposed on and electrically connected to a corresponding one of the metal lines 12'. The material and process for forming the second electrically conductive interconnect 212 are similar to those of the first electrically conductive interconnect 112 as described in step 101, and therefore, the details thereof are omitted for the sake of brevity. The interconnect structure 21 may be formed by a damascene process or the RIE process.

In this disclosure, by selectively forming the functionalized polymers on the lateral surfaces of the metal lines before formation of the ILD layer, and by thermal annealing the functionalized polymers after the formation of the ILD layer, the carbon-based polymer chains of the functionalized polymers are removed to form the air gaps and the protective layers. Each of the protective layers covers a lateral surface of a corresponding one of the metal lines. In addition, by adjusting the molecular weight of the carbon-based polymer chains, the size of each of the air gaps is controllable and the uniformity of the shape of each of the air gaps can be improved, which is conducive to reducing the RC delay and the electronic interference in the semiconductor device. The air gap provided by this disclosure can be formed in the trenches that have various critical dimensions and that are formed among the metal lines.

In accordance with some embodiments of the present disclosure, a method for manufacturing a semiconductor device includes: forming a plurality of spaced-apart metal lines on a conductive interconnect structure disposed on a substrate; forming a plurality of functionalized polymers on a lateral surface of a corresponding one of the metal lines, each of the functionalized polymers including a carbon-based polymer chain and a functional group that is bonded to the lateral surface of the corresponding one of the metal lines, the functional group being represented by formula (A):

(A)

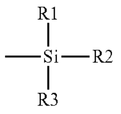

wherein R1, R2, R3 are each independently a methoxy group, a thiol group, or a dihydrogen phosphate group with the proviso that at least one of R1, R2, and R3 is the methoxy group; removing the carbon-based polymer chain of an upper portion of the functionalized polymers to leave the carbon-based polymer chain of remainder of the functionalized polymers so as to form a plurality of recesses, each of which is formed between two corresponding ones of the metal lines; forming a dielectric layer to cover the metal lines and to fill the recesses; and removing the carbon-based polymer chain of the remainder of the functionalized polymers so as to form a plurality of air gaps among the metal lines.

In accordance with some embodiments of the present disclosure, the functional group of each of the functionalized polymers is bonded to the functional group of an adjacent one of the functionalized polymers so as to form a protective layer covering the lateral surface of the corresponding one of the metal lines.

In accordance with some embodiments of the present disclosure, the functional group of each of the functionalized polymers is bonded to the functional group of the adjacent one of the functionalized polymers by a sol-gel reaction.

In accordance with some embodiments of the present disclosure, the carbon-based polymer chain includes a polymer chain of polymethyl methacrylate, polypropylene, polyethylene, epoxy, copolymers thereof, or combinations thereof.

In accordance with some embodiments of the present disclosure, the carbon-based polymer chain has a molecular weight ranging from about 2000 to about 200000.

In accordance with some embodiments of the present disclosure, a distance between a top surface of the remainder of the functionalized polymers and a top surface of each of the metal lines ranges from about 20 Å to about 50 Å.

In accordance with some embodiments of the present disclosure, the method for manufacturing a semiconductor device further includes: after formation of the functionalized polymers and before removal of the carbon-based polymer chain of the upper portion of the functionalized polymers, subjecting the functionalized polymers to a polymerization process.

In accordance with some embodiments of the present disclosure, a method for manufacturing a semiconductor device includes: forming a plurality of spaced-apart metal lines on a conductive interconnect structure disposed on a substrate; forming a plurality of hard masks on the metal lines, respectively; forming a plurality of functionalized polymers on a lateral surface of a corresponding one of the metal lines, each of the functionalized polymers including a carbon-based polymer chain and a functional group that is selectively bonded to the lateral surface of the corresponding one of the metal lines, the functional group being represented by formula (A):

(A)

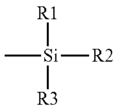

wherein R1, R2, R3 are each independently a methoxy group, a thiol group, or a dihydrogen phosphate group with the proviso that at least one of R1, R2, and R3 is the methoxy group; removing the carbon-based polymer chain of an upper portion of the functionalized polymers to leave the carbon-based polymer chain of remainder of the functionalized polymers so as to form a plurality of recesses, each of which is formed between two corresponding ones of the metal lines; forming a dielectric layer to cover the hard masks and to fill the recesses; and removing the carbon-based polymer chain of the remainder of the functionalized polymers so as to form a plurality of air gaps among the metal lines.

In accordance with some embodiments of the present disclosure, the functional group of each of the functionalized polymers is bonded to the functional group of an adjacent one of the functionalized polymers so as to form a protective layer covering the lateral surface of the corresponding one of the metal lines.

In accordance with some embodiments of the present disclosure, the functional group of each of the functionalized polymers is bonded to the functional group of the adjacent one of the functionalized polymers by a sol-gel reaction.

In accordance with some embodiments of the present disclosure, the carbon-based polymer chain includes a polymer chain of polymethyl methacrylate, polypropylene, polyethylene, epoxy, copolymers thereof, or combinations thereof.

In accordance with some embodiments of the present disclosure, the carbon-based polymer chain has a molecular weight ranging from about 2000 to about 200000.

In accordance with some embodiments of the present disclosure, the carbon-based polymer chain of the remainder of the functionalized polymers is removed by a thermal annealing process.

In accordance with some embodiments of the present disclosure, the thermal annealing process is conducted at a temperature ranging from about 300° C. to about 400° C.

In accordance with some embodiments of the present disclosure, the method for manufacturing a semiconductor device further includes: after formation of the functionalized polymers and before removal of the carbon-based polymer chain of the upper portion of the functionalized polymers, subjecting the functionalized polymers to a polymerization process.

In accordance with some embodiments of the present disclosure, a semiconductor device includes a substrate, a conductive interconnect structure, a plurality of spaced apart metal lines, a plurality of protective layers, a plurality of air gaps, and a dielectric layer. The conductive interconnect structure is disposed on the substrate. The protective layers respectively covers lateral surfaces of the metal lines. Each of the protective layers includes a plurality of functional groups, and each of the functional groups is represented by formula (A):

(A)

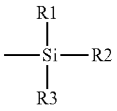

wherein R1, R2, R3 are each independently a methoxy group, a thiol group, or a dihydrogen phosphate group with the proviso that at least one of R1, R2, and R3 is the methoxy group. The air gaps are formed among the metal lines, such that two adjacent ones of the metal lines are spaced apart from each other by at least one of the air gaps. The dielectric layer is disposed on the conductive interconnect structure and cooperates with the conductive interconnect structure and the protective layers to define the air gaps.

In accordance with some embodiments of the present disclosure, the air gaps have a width ranging from about 5 nm to about 15 nm.

In accordance with some embodiments of the present disclosure, the air gaps have a height ranging from about 150 Å to about 480 Å.

In accordance with some embodiments of the present disclosure, one of the air gaps is disposed between two corresponding ones of the protective layers.

In accordance with some embodiments of the present disclosure, one of the air gaps is disposed between a corresponding one of the protective layers and a portion of the dielectric layer.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:

forming metal lines on a conductive interconnect structure disposed on a substrate, the metal lines being spaced apart from each other;

forming functionalized polymers on a lateral surface of a corresponding one of the metal lines, each of the functionalized polymers including a carbon-based polymer chain and a functional group that is bonded to the lateral surface of the corresponding one of the metal lines, the functional group being represented by formula (A):

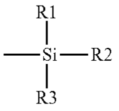

(A)

wherein R1, R2, R3 are each independently a methoxy group, a thiol group, or a dihydrogen phosphate group with the proviso that at least one of R1, R2, and R3 is the methoxy group;

removing the carbon-based polymer chain of an upper portion of the functionalized polymers to leave the carbon-based polymer chain of a remainder of the functionalized polymers so as to form recesses, each of which is formed between two corresponding ones of the metal lines;

forming a dielectric layer to cover the metal lines and to fill the recesses; and removing the carbon-based polymer chain of the remainder of the functionalized polymers so as to form air gaps among the metal lines.

2. The method as claimed in claim 1, wherein the functional group of each of the functionalized polymers is bonded to the functional group of an adjacent one of the functionalized polymers so as to form a protective layer covering the lateral surface of the corresponding one of the metal lines.

3. The method as claimed in claim 2, wherein the functional group of each of the functionalized polymers is bonded to the functional group of the adjacent one of the functionalized polymers by a sol-gel reaction.

4. The method as claimed in claim 1, wherein the carbon-based polymer chain includes a polymer chain of polymethyl methacrylate, polypropylene, polyethylene, epoxy, copolymers thereof, or combinations thereof.

5. The method as claimed in claim 1, wherein the carbon-based polymer chain has a molecular weight ranging from 2000 to 200000.

6. The method as claimed in claim 1, wherein a distance between a top surface of the remainder of the functionalized polymers and a top surface of each of the metal lines ranges from 20 Å to 50 Å.

7. The method as claimed in claim 1, further comprising, after formation of the functionalized polymers and before removal of the carbon-based polymer chain of the upper portion of the functionalized polymers, subjecting the functionalized polymers to a polymerization process.

8. A method for manufacturing a semiconductor device, comprising:

forming metal lines on a conductive interconnect structure disposed on a substrate, the metal lines being spaced apart from each other;

forming hard masks on the metal lines, respectively;

forming functionalized polymers on a lateral surface of a corresponding one of the metal lines, each of the functionalized polymers including a carbon-based polymer chain and a functional group that is selectively bonded to the lateral surface of the corresponding one of the metal lines, the functional group being represented by formula (A):

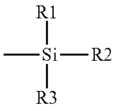

(A)

wherein R1, R2, R3 are each independently a methoxy group, a thiol group, or a dihydrogen phosphate group with the proviso that at least one of R1, R2, and R3 is the methoxy group;

removing the carbon-based polymer chain of an upper portion of the functionalized polymers to leave the carbon-based polymer chain of a remainder of the functionalized polymers so as to form recesses, each of which is formed between two corresponding ones of the metal lines;

forming a dielectric layer to cover the hard masks and to fill the recesses; and removing the carbon-based polymer chain of the remainder of the functionalized polymers so as to form air gaps among the metal lines.

9. The method as claimed in claim 8, wherein the functional group of each of the functionalized polymers is bonded to the functional group of an adjacent one of the functionalized polymers so as to form a protective layer covering the lateral surface of the corresponding one of the metal lines.

10. The method as claimed in claim 9, wherein the functional group of each of the functionalized polymers is bonded to the functional group of the adjacent one of the functionalized polymers by a sol-gel reaction.

11. The method as claimed in claim 8, wherein the carbon-based polymer chain includes a polymer chain of polymethyl methacrylate, polypropylene, polyethylene, epoxy, copolymers thereof, or combinations thereof.

12. The method as claimed in claim 8, wherein the carbon-based polymer chain has a molecular weight ranging from 2000 to 200000.

13. The method as claimed in claim 8, wherein the carbon-based polymer chain of the remainder of the functionalized polymers is removed by a thermal annealing process.

14. The method as claimed in claim 13, wherein the thermal annealing process is conducted at a temperature ranging from 300° C. to 400° C.

15. The method as claimed in claim 8, further comprising, after formation of the functionalized polymers and before removal of the carbon-based polymer chain of the upper portion of the functionalized polymers, subjecting the functionalized polymers to a polymerization process.

16. A method for manufacturing a semiconductor device, comprising:

forming metal lines over a substrate, the metal lines being spaced apart from each other;

forming functionalized polymers on a lateral surface of a corresponding one of the metal lines, each of the functionalized polymers including a carbon-based polymer chain and a functional group that is bonded to the lateral surface of the corresponding one of the metal lines, the functional group being represented by formula (A):

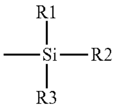

(A)

wherein R1, R2, R3 are each independently a methoxy group, a thiol group, or a dihydrogen phosphate group with the proviso that at least one of R1, R2, and R3 is the methoxy group;

removing the carbon-based polymer chain of an upper portion of the functionalized polymers to leave the carbon-based polymer chain of a remainder of the functionalized polymers so as to form recesses, each of which is formed between two corresponding ones of the metal lines;

forming a dielectric layer to cover the metal lines and to fill the recesses;

removing the carbon-based polymer chain of the remainder of the functionalized polymers so as to form air gaps among the metal lines; and forming an interconnect structure on the dielectric layer opposite to the substrate, the interconnect structure including an electrically conductive interconnect electrically connected to one of the metal lines.

17. The method as claimed in claim 16, wherein the dielectric layer is formed to include a porous material such that the carbon-based polymer chains of the remainder of the functionalized polymers are removed through pores of the dielectric layer.

18. The method as claimed in claim 17, wherein the dielectric layer has a porosity ranging from 20% to 40%.

19. The method as claimed in claim 16, wherein two adjacent ones of the metal lines are spaced apart from each other by two corresponding ones of the air gaps.

20. The method as claimed in claim 19, wherein two corresponding ones of the air gaps are spaced apart from each other by a portion of the dielectric layer.

* * * * *